United States Patent [19]
Crawford et al.

[11] Patent Number: 5,928,819
[45] Date of Patent: Jul. 27, 1999

[54] METHODS TO FABRICATE OPTICAL EQUIVALENTS OF FIBER OPTIC FACE PLATES USING REACTIVE LIQUID CRYSTALS AND POLYMERS

[75] Inventors: Gregory P. Crawford, Providence, R.I.; Thomas G. Fiske, Campbell, Calif.; Louis D. Silverstein, Scottsdale, Ariz.

[73] Assignee: Xerox Corporation, Stamford, Conn.

[21] Appl. No.: 08/769,555

[22] Filed: Dec. 19, 1996

[51] Int. Cl.[6] .............................. G03C 5/00; G02B 6/08
[52] U.S. Cl. .......................... 430/20; 430/290; 430/321
[58] Field of Search ............................ 430/321, 20, 290; 349/193, 196, 197, 200; 385/120

[56] References Cited

U.S. PATENT DOCUMENTS

| | | | |
|---|---|---|---|
| 4,721,352 | 1/1988 | Sorin et al. | 350/96.15 |
| 4,743,410 | 5/1988 | Grethen et al. | 264/1.4 |
| 4,893,907 | 1/1990 | Mallinson | 350/350 S |
| 4,983,479 | 1/1991 | Broer et al. | 430/20 |
| 5,170,455 | 12/1992 | Goossen et al. | 385/89 |
| 5,317,429 | 5/1994 | Mochizuki et al. | 359/42 |
| 5,361,320 | 11/1994 | Liu et al. | 385/143 |
| 5,389,312 | 2/1995 | Lebby et al. | 264/1.24 |
| 5,442,467 | 8/1995 | Silverstein et al. | 359/42 |
| 5,462,700 | 10/1995 | Beeson et al. | 264/1.27 |
| 5,589,101 | 12/1996 | Khoo | 252/299.01 |
| 5,671,034 | 9/1997 | May et al. | 349/200 |

FOREIGN PATENT DOCUMENTS 3-245106  10/1991  Japan.

*Primary Examiner*—John A. McPherson

[57] ABSTRACT

Methods for making plates which have columnar features approximately in the direction of light propagation which are capable of total internal reflection, a controllable numeric aperture (NA) at input and output surfaces, rotational azimuthal averaging and translation of the object plane from a back surface of the plate to a front surface of the plate and are optical equivalent of a FOFP. These plates are made from a range of materials including a variety of monomer or polymer networks. The resultant plates contain adjacent areas with differing refractive indices which result in a substrate containing a plurality of cylindrical features whose boundaries are defined by a discontinuity of refractive indices wherein the index of refraction within the cylindrical features is greater than the index of refraction at the boundaries and external to the cylindrical features.

28 Claims, 15 Drawing Sheets

500
METHODS TO FABRICATE OPTICAL EQUIVALENTS OF FIBER OPTIC FACE PLATES USING REACTIVE LIQUID CRYSTALS AND POLYMERS

CROSS REFERENCE TO RELATED APPLICATIONS

This application is related to our application U.S. Ser. No. 08/769,388, now U.S. Pat. No. 5,726,730 and our application U.S. Ser. No. 08/769,361, now abandoned, both filed concurrently herewith.

BACKGROUND

This invention relates generally to fiber optic face plates and more particularly concerns methods in which reactive liquid crystals and polymers can be utilized for fabrication of fiber optic faceplate equivalents.

Fiber optic faceplates (FOFPs) are useful in the construction of liquid crystal displays as disclosed in U.S. Pat. No. 5,442,467, filed on Mar. 21, 1994, by Silverstein et al., the subject matter of which is incorporated herein by reference. U.S. Pat. No. 5,442,467 discloses a direct-view rear-illuminated LCD device, comprising: a backlight source; a rear diffuser layer; a rear polarizer; a LC cell including a rear glass layer with addressing elements and indium tin oxide (ITO) transparent pixel electrodes, a LC layer having a top and bottom surface, and a front FOFP as a front containing element of the LC cell and being located directly in contact with the top surface of the liquid crystal layer; a mosaic array of color absorption filters either deposited on the front face of the FOFP or located on a separate but adjacent substrate; and a front polarizer or analyzer. Alternatively, the front polarizer or analyzer may be constructed from thin-film materials and located between the top or light exit surface of the LC layer and the bottom or light input surface of the FOFP.

An FOFP comprises an array of individual optical fibers which are fused together with an interstitial cladding material and then cut and polished to a desired thickness to form a plate. The creation of FOFPs with varying optical characteristics is well known in the art. The optical fibers are designed to transmit through total internal reflection light incident at controlled input or acceptance angles while rejecting or absorbing light incident at larger angles. Light entering the fibers at an entrance plane of the FOFP is collected over a wide acceptance angle $\theta_{Max}$IN by use of a high numerical aperture (NA) FOFP and/or coupling to a boundary of low refractive index (e.g., air). Light exiting the optical fibers at an exit plane of the FOFP is made to diverge or exit over a relatively wide angle $\theta_{Max}$OUT also by use of a high NA and/or the ultimate coupling to a low refractive index boundary. FOFPs with low NAs and/or coupling to relatively high refractive index materials (e.g., plastic, polyimide, or optical glass) restrict the light output exit angle, $\theta_{Max}$OUT, of the exit plane of the FOFP and the light input acceptance angle, $\theta_{Max}$IN, of the entrance plane of the FOFP, respectively.

These relations are illustrated in FIG. 1 for a typical optical fiber 10. Light beam 16 enters the optical fiber 10 within the acceptance cone 20 defined by an angle $\theta_{max}$, which is measured from normal line N. and is totally internally reflected within a core 12 of the optical fiber 10 to propagate down the length of the optical fiber 10, essentially without loss. The normal N is perpendicular to an entrance plane 30 and an exit plane 32 of the optical fiber 10. If the relative index of material surrounding the optical fiber 10 at the entrance plane 30 and exit plane 32 surfaces ($N_o$) is the same, then the light beam 16 will exit the optical fiber 10 at the same angle, in this example $\theta_{max}$, which it entered. Light beam 18, which enters the optical fiber 10 outside of the acceptance cone 20 defined by $\theta_{max}$ is not fully guided through the length of the optical fiber 10 and "leaks" out of the optical fiber 10 into adjacent cladding material 14. Light beam 16 is a guided light beam while light beam 18 is an unguided light beam. An unguided or partially guided light beam may pass through the cladding material 14 and enter other fibers in a fiber-optic bundle or fused faceplate. However, unguided or partially guided light beams typically leak out of these fibers as well and continue to traverse the bundle or faceplate.

FIGS. 2 and 3 show the effects of varying the numerical aperture of the optical fiber 10. FIG. 2 shows the optical fiber 10 having a small numerical aperture and thus a smaller light acceptance cone 20. FIG. 3 shows the optical fiber 10 having a large numerical aperture and thus a larger light acceptance cone 20. Thus, the higher the numerical aperture of the fiber 10, the larger $\theta_{max}$ at the entrance plane 30 and the exit plane 32.

In general, light which enters the optical fiber 10 is rotated about a central axis of the optical fiber 10 as it propagates along the length of the optical fiber 10 as shown in FIG. 4. In this example the central axis of the optical fiber 10 happens to be coincident with the normal N used to measure the angle $\theta_{max}$. Thus, light which enters at a given angle from the normal N to the fiber input surface exits the optical fiber 10 at the same exit angle, but at a rotated azimuthal position. This rotation is dependent on the number of reflections within the optical fiber 10 and also by the internal surfaces of the fibers. Skew rays typically undergo more rotation than meridional rays. For the application of FOFPs to LCDs, most of the illumination entering the fiber will be skew rays.

In FIG. 4, a light ray 24 and a light ray 26 can be seen entering the optical fiber 10 at the entrance plane 30 at an angle $\theta_{max}$ measured with respect to a normal N. Light ray 24 is parallel to light ray 26 and they enter the optical fiber at different points on the entrance plane 30. As each light ray 24, 26 exits at the output plane 32 of the optical fiber 10, it can be seen that each light ray 24, 26 exits at an angle $\theta_{max}$ but having undergone an azimuthal rotation angle φ around the central axis of the optical fiber 10.

As explained above, in fused fiber optic bundles and faceplates, both guided and unguided rays undergo azimuthal rotation. As shown in FIG. 4, the consequence of this rotation is that the optical fiber 10 averages about the azimuthal position all of the incoming light entering at a given declination angle such that the output consists of a hollow exit cone 22 with a solid angle of twice the entrance angle. In FIG. 4, because both illustrated incoming light rays 24, 26 enter the optical fiber 10 at an angle $\theta_{max}$, the solid angle of the hollow exit cone 22 is $2\theta_{max}$. As the light emerging as a hollow exit cone 22 consists of an average about the azimuthal position, the transmitted light intensity is equal at all azimuthal angles. It is this property of azimuthal averaging that enables FOFPs to produce symmetrical viewing characteristics over wide angles when coupled to a LCD with inherent anisotropies in luminance and contrast.

FIG. 5 illustrates an FOFP 28 made of an array of individual optical fibers which are fused together with an interstitial cladding material and then cut and polished to a desired thickness to form a plate. The core 12 and cladding material 14 can be seen on the surface of the FOFP 28.

Therefore, any plate which has columnar features approximately in the direction of light propagation which are capable of total internal reflection, a controllable numeric aperture (NA) at input and output surfaces, rotational azimuthal averaging and translation of the object plane from a back surface of the plate to a front surface of the plate is the optical equivalent of a FOFP. These essential optical properties can be imparted to a range of materials, thus producing the FOFP optical equivalents. This application discusses a variety of monomer or polymer networks containing adjacent areas with differing refractive indices which result in a substrate containing a plurality of cylindrical features whose boundaries are defined by a discontinuity of refractive indices wherein the index of refraction within the cylindrical features is greater than the index of refraction at the boundaries and external to the cylindrical features.

Accordingly, it is the primary aim of the invention to produce substrates containing a plurality of cylindrical features whose boundaries are defined by a discontinuity of refractive indices wherein the index of refraction within the cylindrical features is greater than the index of refraction at the boundaries and external to the cylindrical features and wherein the substrates are fabricated out of reactive monomers or polymers.

Further advantages of the invention will become apparent as the following description proceeds.

SUMMARY OF THE INVENTION

Briefly stated and in accordance with the present invention, there are provided FOFP optical equivalents using reactive materials and methods for making same.

While the present invention will be described in connection with a preferred embodiment and method of use, it will be understood that it is not intended to limit the invention to that embodiment or procedure. On the contrary, it is intended to cover all alternatives, modifications and equivalents as may be included within the spirit and scope of the invention as defined by the appended claims.

DETAILED DESCRIPTION OF THE INVENTION

Figure 1:
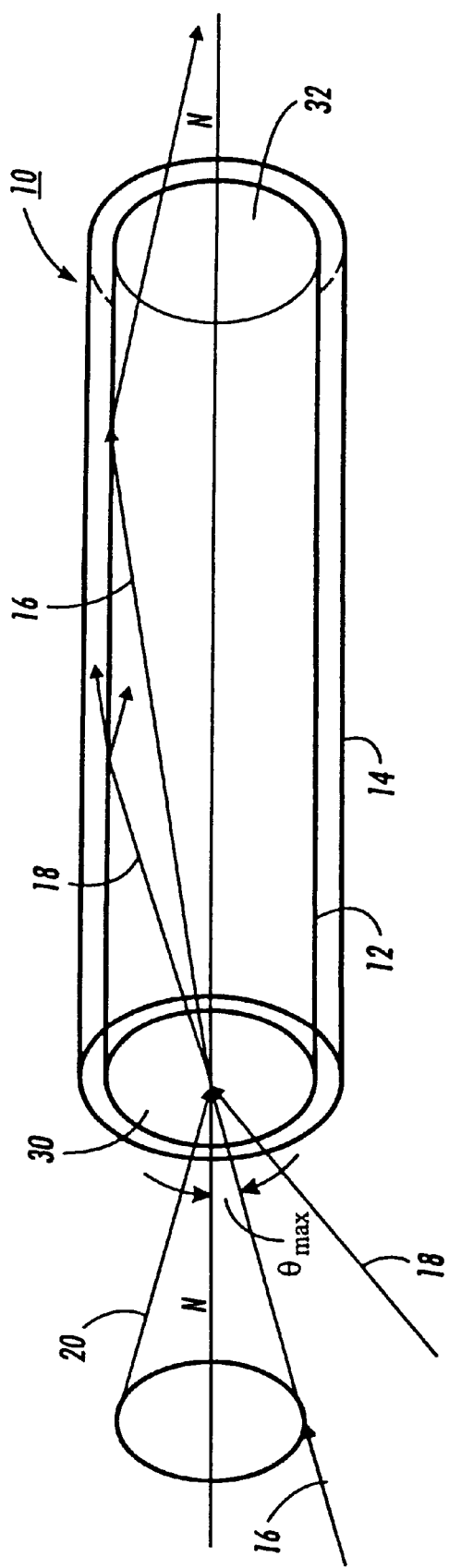
FIG. 1 is a side view of an optic fiber illustrating an acceptance cone of light entering the optic fiber and guided and unguided light rays.
Figure 2:
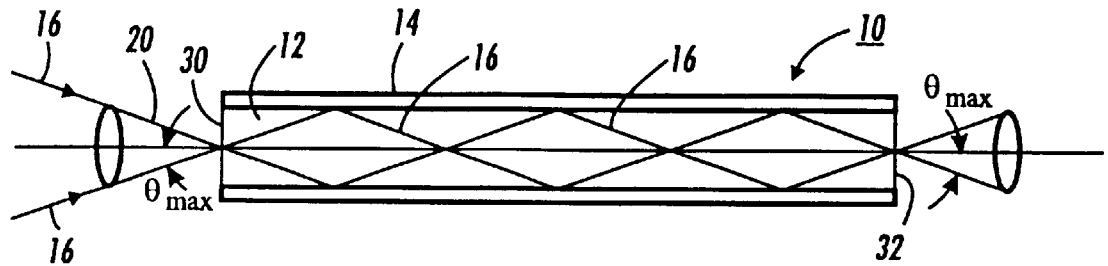
FIG. 2 is a side view of an optic fiber illustrating a narrow acceptance cone.
Figure 3:
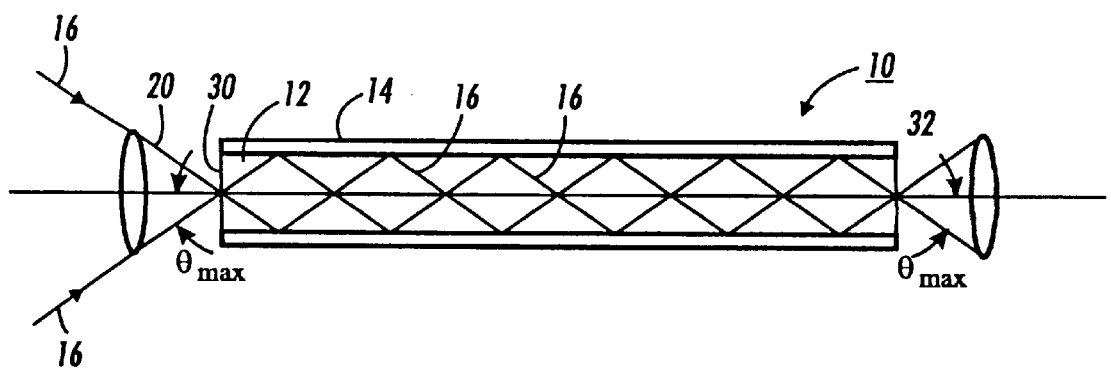
FIG. 3 is a side view of an optic fiber illustrating a wide acceptance cone.
Figure 4:
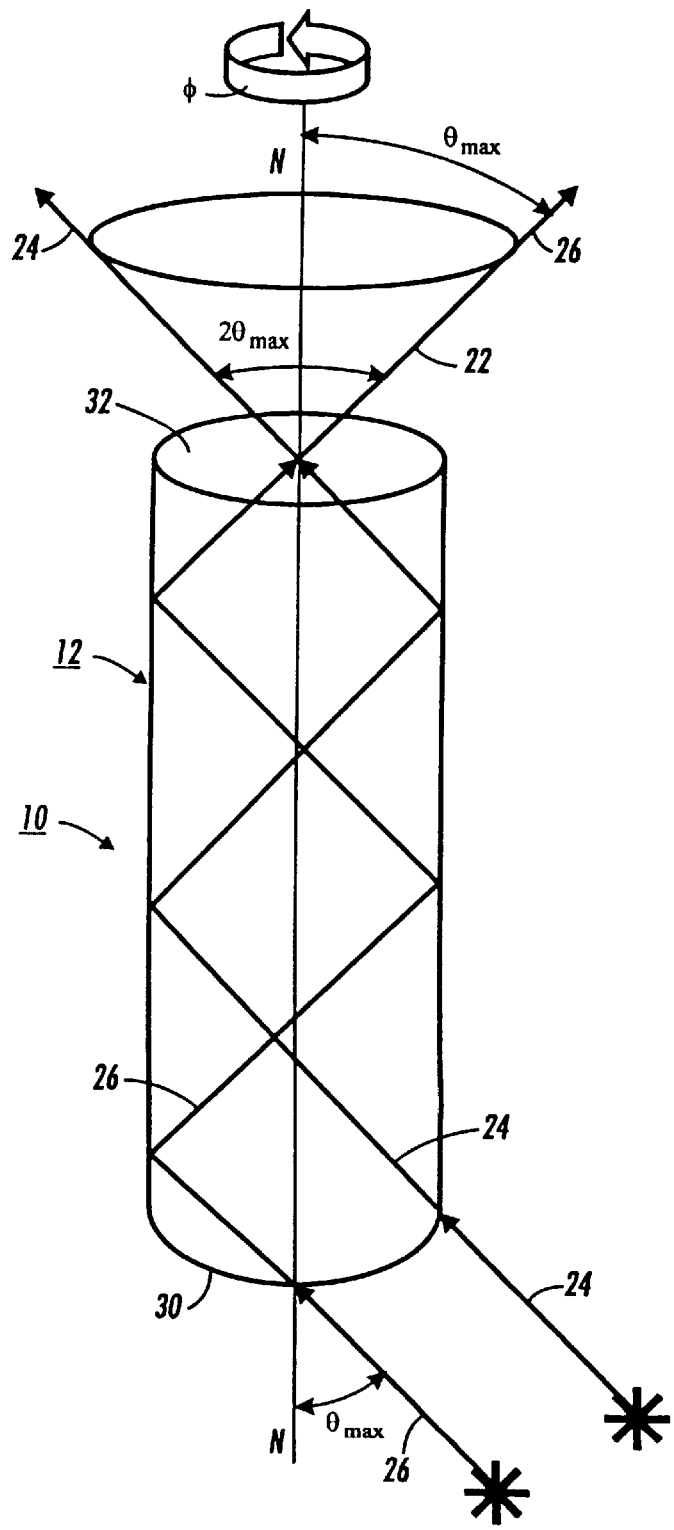
FIG. 4 is a side view of an optic fiber illustrating azimuthal averaging.
Figure 5:
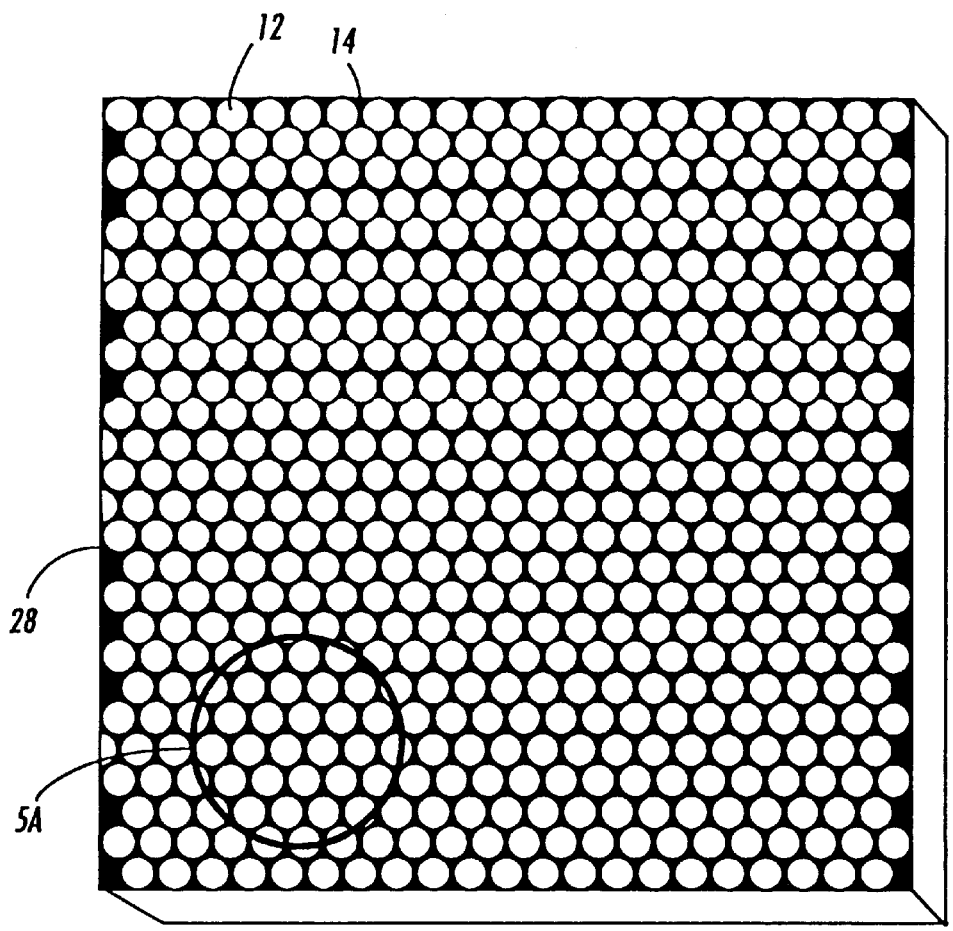
FIG. 5 is a top view of a prior art FOFP.
Figure 5A:
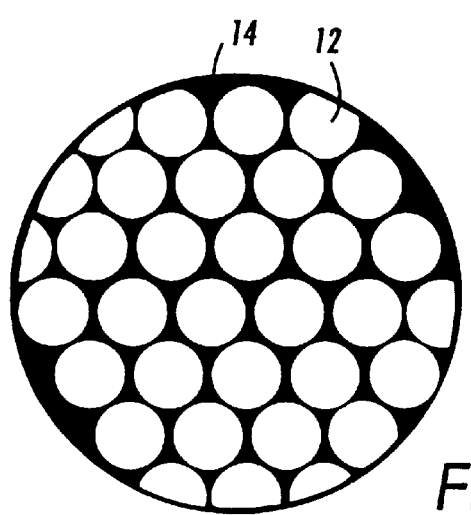
FIG. 5a is an expanded view of a portion of the FOFP of FIG. 5.
Figure 6:
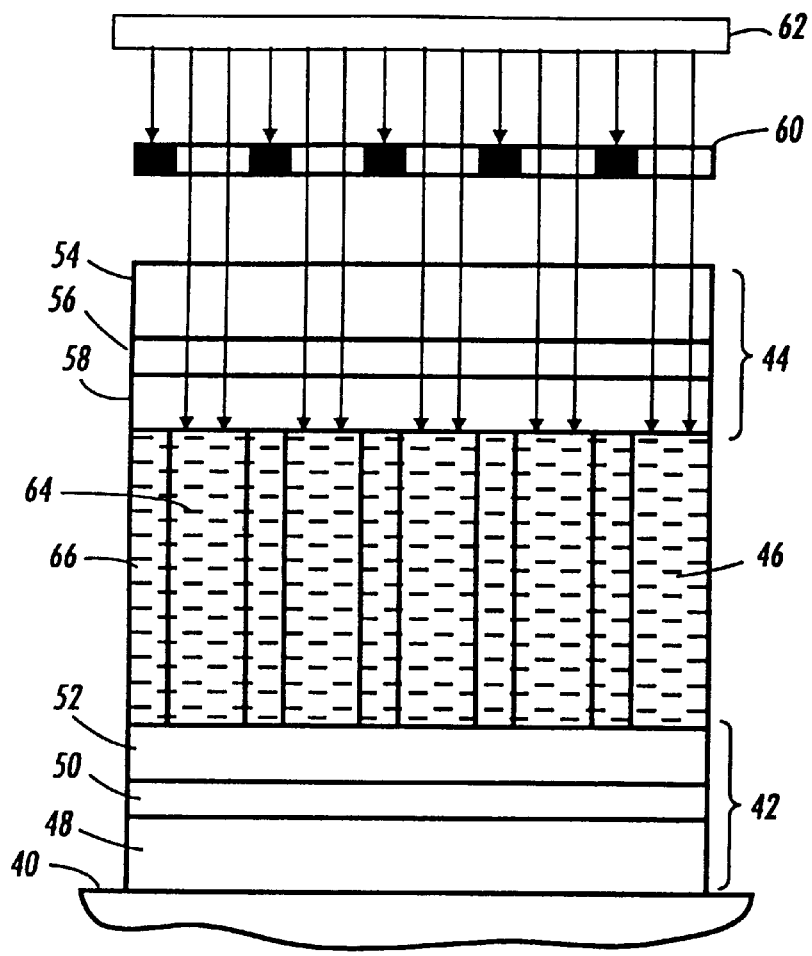
FIG. 6 is a side view of a reactive liquid crystal in a first process step to make an FOFP optical equivalent according to the present invention.

Turning now to FIG. 6, a bottom substrate 42 and a top substrate 44 with a reactive liquid crystal 46 interposed in between is shown residing on a temperature control holding device 40. The bottom substrate 42 and the top substrate 44 are each comprised of three layers, the bottom substrate 42 has an alignment layer 52, ITO (Indium Tin Oxide) electrodes 50 and glass 48 while the top substrate 44 has an alignment layer 58, ITO electrodes 56, and glass 54. The reactive liquid crystal 46 can be a variety of photoreactive materials of which the commercially available materials compounds of RM1, RM82, and RM257 from EM Industries are examples. The important property of these photoreactive liquid crystal compounds is the ability to set up two different indices of refraction dependent upon the alignment of polymer fibrils within the reactive liquid crystal 46.

The reactive liquid crystal 46 is divided into two types of areas, "core" areas 64 and "cladding" areas 66. In order for the reactive liquid crystal 46 to operate as a FOFP, the "core" areas 64 must exhibit total internal reflection of any light entering the "core" areas 64. In order for total internal reflection to take place within the core areas 64 an index of refraction ($n_{core}$) for the "core" areas 64 must be greater than an index of refraction ($n_{clad}$) for the "cladding" areas 66. The difference in indices of refraction between the "core" areas 64 and "cladding" areas 66 is expressed as a numerical aperture (NA) which is the square root of the difference of the squares of the two indices of refraction, and is described by the equation:

$$NA = [n^2_{core} - n^2_{clad}]^{1/2}.$$

Fiber optic faceplates with numerical apertures in the approximate range of 0.4 to 1.0 are suitable for use in various applications of liquid crystal displays.

In order to set up the different indices of refraction in the "core" areas 64 and the "cladding" areas 66, the reactive liquid crystal 46 must first be at a temperature where it is in a stable nematic phase. The nematic phase is characterized by an arrangement in which the long axes of molecules in the liquid crystal are parallel to each other but not separated into layers. This long-range orientational order is temperature dependent and varies according to the specific liquid crystal monomer used. The temperature control holding device 40 is used to provide the correct temperature for the stable nematic phase of the reactive liquid crystal 46 if needed. The long axes of the molecules are aligned due to the alignment layer 52 and the alignment layer 58. The alignment layer 52 and the alignment layer 58 can be any substance or structure which causes the axes of the molecules to align in a primary direction, such as a rubbed polyimide for homogeneous alignment or a surfactant treated for homeotropic alignment. At this stage the reactive liquid crystal 46 is a low molecular weight reactive monomer liquid crystal.

Figure 7:
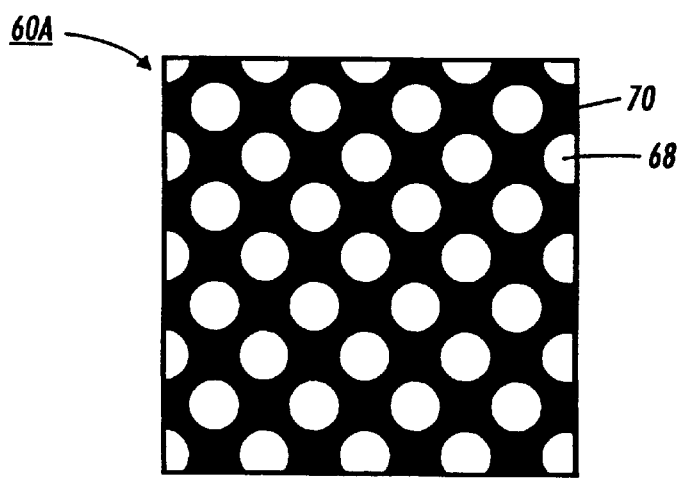
FIG. 7 is a top view of a mask used in the process step shown in FIG. 6.

The reactive liquid crystal 46 is then irradiated with collimated UV radiation 62 through a mask 60. A top view of the mask 60 is shown in FIG. 7. The mask 60 is divided into transparent core irradiation areas 68 and opaque cladding non-irradiation areas 70. The collimated UV radiation 62 will pass through the core irradiation areas 68 of the mask 60 and strike the reactive liquid crystal 46 causing it to initialize polymerization such that the irradiated molecules begin to combine and form larger molecules. The initial polymerization of the irradiated portions of the reactive liquid crystal 46 in the "core" areas 64 causes the molecular order of the reactive liquid crystal 46 in the "core" areas 64 to be locked in as solid, aligned polymer fibrils are formed. Once the reactive liquid crystal 46 has been polymerized it has changed from a low molecular weight reactive monomer liquid crystal into an rigid ordered polymer liquid crystal thereby capturing the alignment direction.

Figure 8:
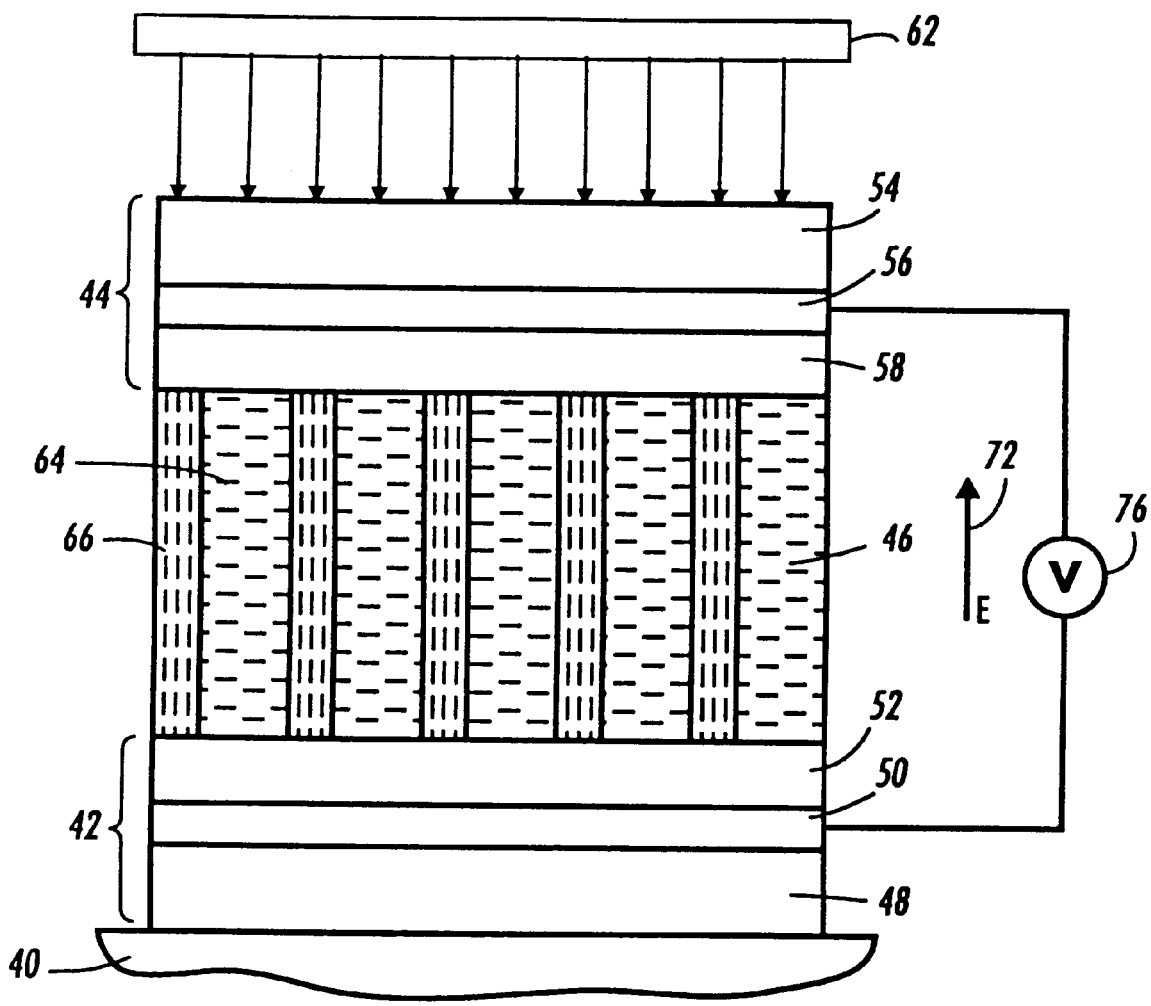
FIG. 8 is a side view of a reactive liquid crystal in a second process step to make an FOFP optical equivalent according to the present invention.

Once photopolymerization of the reactive liquid crystal 46 in the "core" areas 64 has taken place, then a voltage source 76 which causes an electric field 72 to form is placed across the bottom substrate 42 and the top substrate 44 as shown in FIG. 8. The electric field 72 should preferably be within the range of 1–4 volts per micrometer (1–4 v/μm).

The electric field 72 is not strong enough to change the alignment of the rigidly aligned and polymerized reactive liquid crystal 46 in the "core" areas 64 but is strong enough to change the alignment of the reactive liquid crystal 46 in the "cladding" areas 66 which has not been polymerized. The reactive liquid crystal 46 in the "cladding" areas 66 should be aligned transversely or crosswise, and possibly perpendicular, to the rigidly aligned and polymerized reactive liquid crystal 46 in the "core" areas 64. The alignment change is proportional to the strength of the electric field 72 used, with a stronger electric field 72 necessary to achieve perpendicular or near perpendicular alignment. Once the unpolymerized reactive liquid crystal 46 in the "cladding" areas 66 have been aligned to be transverse to the rigidly aligned and polymerized reactive liquid crystal 46 in the "core" areas 64 the reactive liquid crystal 46 is again radiated with the collimated UV radiation 62. In this instance, no mask is needed and polymerization will be initiated in the unpolymerized reactive liquid crystal 46 in the "cladding" areas 66.

A structure constructed as above using the above named materials will have an index of refraction for the "core" areas 64 of approximately 1.7 and an index of refraction for the "cladding" areas 66 of approximately 1.5. These indices of refraction lead to a numeric aperture of $NA = [n^2_{core} - n^2_{clad}]^{1/2} = [1.7^2 - 1.5^2]^{1/2} = 0.8$. The index of refraction for the "core" areas 64 will depend upon field strengths and temperature during polymerization, leading to a tunable numeric aperture for the resultant device. In principle, the index of refraction for the "core" areas 64 can vary from approximately 1.6 to approximately 1.7 and the index of refraction for the "cladding" areas 66 can vary from approximately 1.5 to approximately 1.7. There is an interface between the "core" areas 64 and the "cladding" areas 66 which is critical for performance characteristics, therefore it is important to use a reactive liquid crystal 46 in which a discontinuity in the refractive indices will exist between the "core" areas 64 and the "cladding" areas 66 in the finished product to achieve optimal performance for the resultant FOFP optical equivalent.

Figure 9:
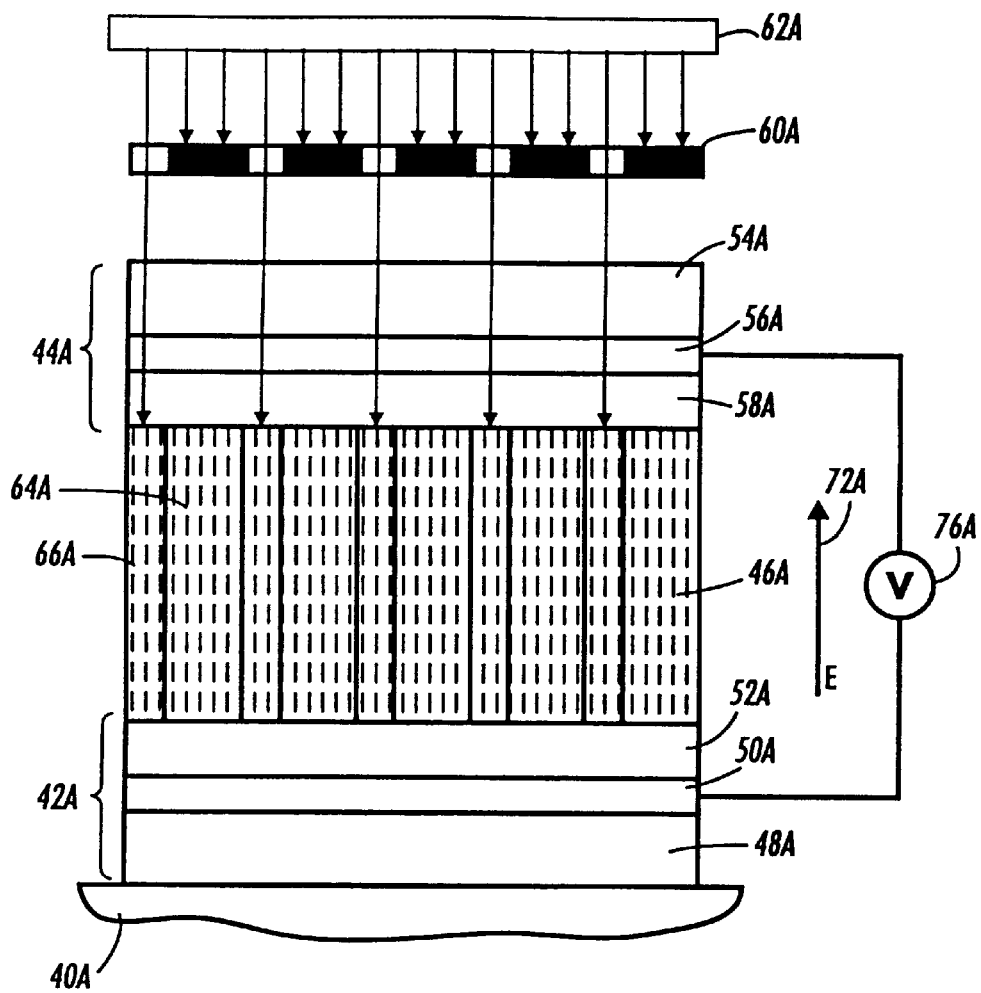
FIG. 9 is a side view of a reactive liquid crystal in a first process step to make an FOFP optical equivalent according to a second embodiment of the present invention.
Figure 10:
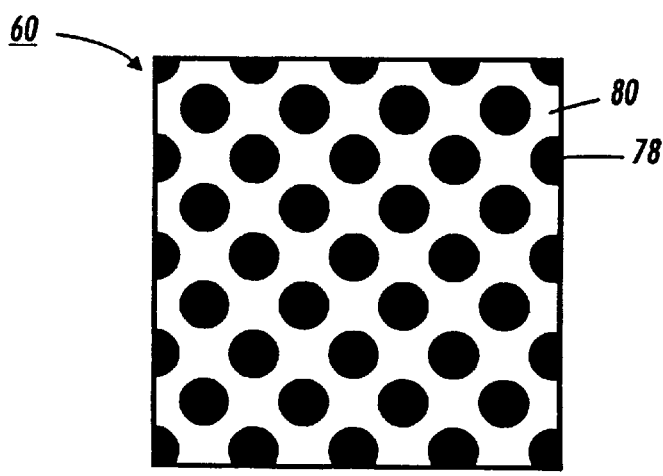
FIG. 10 is a top view of a mask used in the process step shown in FIG. 9.
Figure 11:
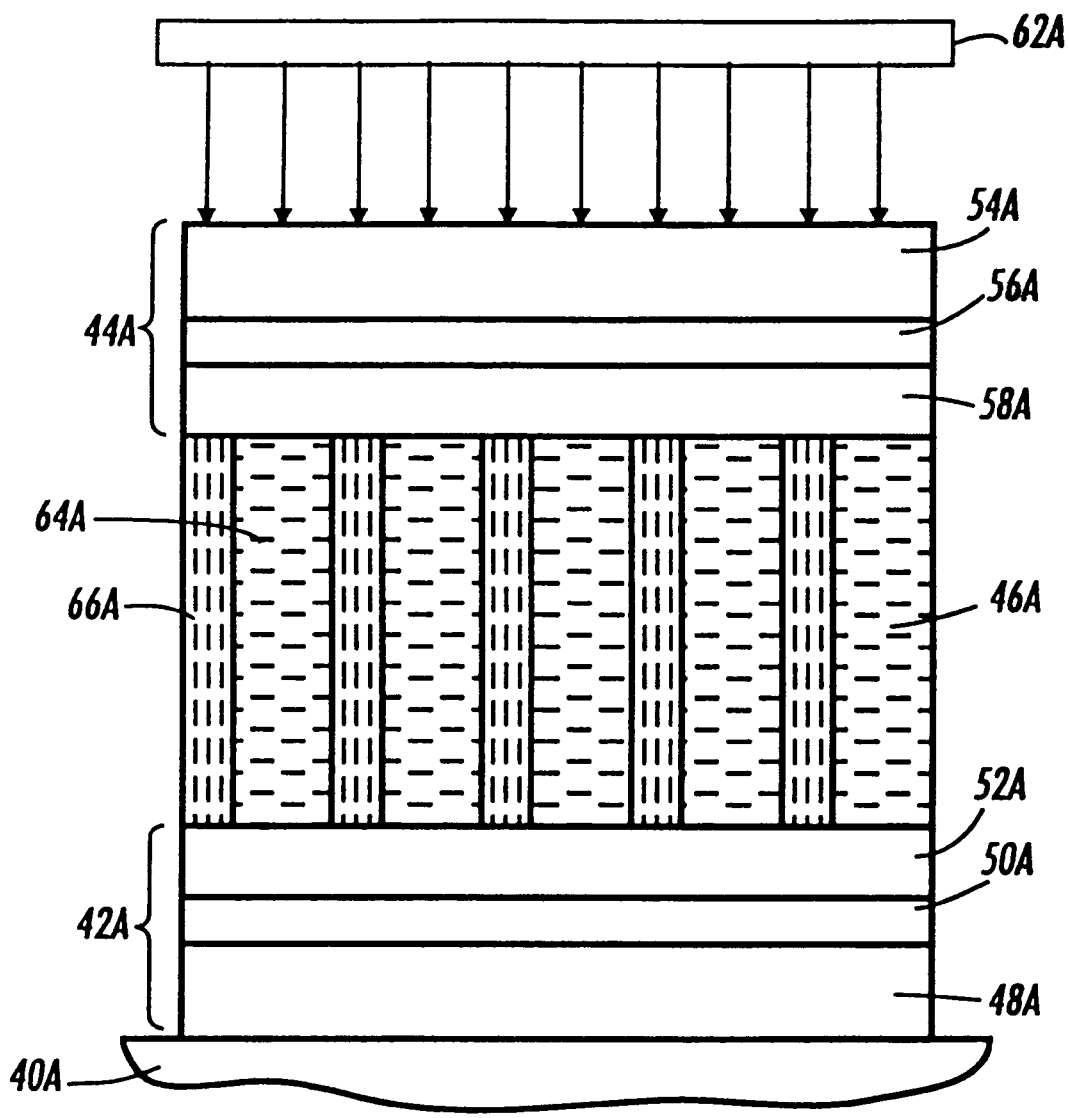
FIG. 11 is a side view of a reactive liquid crystal in a second process step to make an FOFP optical equivalent according to the second embodiment of the present invention.

It should be possible to perform this sequence in the reverse order and achieve similar results, as shown in FIGS. 9–11. The same reference numerals will be shown in FIGS. 9–11 to denote equivalent structures with the extension "A" or equivalently "a" appended to the reference numeral.

Turning now to FIG. 9, a bottom substrate 42a and a top substrate 44a with a reactive liquid crystal 46a interposed in between is shown residing on a temperature control holding device 40a. The bottom substrate 42a and the top substrate 44a are each comprised of three layers, the bottom substrate 42a has an alignment layer 52a, ITO electrodes 50a and glass 48a while the top substrate 44a has an alignment layer 58a, ITO electrodes 56a, and glass 54a. The reactive liquid crystal 46a can be a variety of photoreactive materials of which the commercially available materials compounds of RM1, RM82, and RM257 from EM Industries are examples.

The reactive liquid crystal 46a is divided into two types of areas, "core" areas 64a and "cladding" areas 66a. In order to set up the different indices of refraction in the "core" areas 64a and the "cladding" areas 66a, the reactive liquid crystal 46a must first be at a temperature where it is in a stable nematic phase. The nematic phase is characterized by an arrangement in which the long axes of molecules in the liquid crystal are parallel to each other but not separated into layers. This long-range orientational order is temperature dependent and varies according to the specific liquid crystal monomer used. The temperature control holding device 40a is used to provide the correct temperature for the stable nematic phase of the reactive liquid crystal 46a if needed. The long axes of the molecules are aligned due to the alignment layer 52a and the alignment layer 58a. The alignment layer 52a and the alignment layer 58a can be any substance or structure which causes the axes of the molecules to align in a primary direction, such as a rubbed polyimide for homogeneous alignment or a surfactant treated for homeotropic alignment. At this stage the reactive liquid crystal 46a is a low molecular weight reactive monomer liquid crystal.

A voltage source 76A which causes an electric field 72A to form is placed across the bottom substrate 42A and the top substrate 44A as shown in FIG. 9. The electric field 72 should preferably be within the range of 1–4 volts per micrometer (1–4 v/μm). The reactive liquid crystal 46A is then irradiated with collimated UV radiation 62A through a mask 60A. A top view of the mask 60A is shown in FIG. 10. The mask 60a is divided into transparent cladding irradiated areas 80 and opaque core non-irradiated areas 78. The collimated UV radiation 62A will pass through the cladding irradiated areas 80 of the mask 60a and strike the reactive liquid crystal 46a causing it to initialize polymerization such that the irradiated molecules begin to combine and form larger molecules. The initial polymerization of the irradiated portions of the reactive liquid crystal 46a in the "cladding" areas 66a causes the molecular order of the reactive liquid crystal 46a in the "cladding" areas 66a to be locked in as solid, aligned polymer fibrils are formed. Once the reactive liquid crystal 46a has been polymerized it has changed from a low molecular weight reactive monomer liquid crystal into an rigid ordered polymer liquid crystal thereby capturing the alignment direction.

Once photopolymerization of the reactive liquid crystal 46a in the "cladding" areas 66a has taken place, then the electric field 72a is removed and the unpolymerized reactive liquid crystal 46a in the "core" areas 64a is free to settle into an alignment pattern due to the alignment layer 52a and the alignment layer 58a, as it was before the electric field 72a was applied.

The reactive liquid crystal 46a in the "core" areas 64a should now be aligned transversely or crosswise, and possibly perpendicular, to the rigidly aligned and polymerized reactive liquid crystal 46a in the "cladding" areas 66a as shown in FIG. 11. Once the unpolymerized reactive liquid crystal 46a in the "core" areas 64a have been aligned to be transverse to the rigidly aligned and polymerized reactive liquid crystal 46a in the "cladding" areas 66a the reactive liquid crystal 46a is again radiated with the collimated UV radiation 62a. In this instance, no mask is needed and polymerization will be initiated in the unpolymerized reactive liquid crystal 46a in the "core" areas 64a.

A structure constructed as above using the above named materials will have an index of refraction for the "core" areas 64a of approximately 1.7 and an index of refraction for the "cladding" areas 66a of approximately 1.5. These indices of refraction lead to a numeric aperture of NA=$[n^2_{core}-n^2_{clad}]^{1/2}$=$[1.7^2-1.5^2]^{1/2}$=0.8. The index of refraction for the "core" areas 64A will depend upon field strengths and temperature during polymerization, leading to a tunable numeric aperture for the resultant device. In principle, the index of refraction for the "core" areas 64a can vary from approximately 1.6 to approximately 1.7 and the index of refraction for the "cladding" areas 66a can vary from approximately 1.5 to approximately 1.7. There is an interface between the "core" areas 64a and the "cladding" areas 66a which is critical for performance characteristics; therefore, it is important to use a reactive liquid crystal 46a in which a discontinuity in the refractive indices will exist between the "core" areas 64a and the "cladding" areas 66a in the finished product to achieve optimal performance for the resultant FOFP optical equivalent. It is believed that the process illustrated in FIGS. 9–11 while feasible, may not result in a finished FOFP optical equivalent with the same "clean" discontinuity as believed possible with the process sequence illustrated in FIGS. 6–8.

Figure 12:
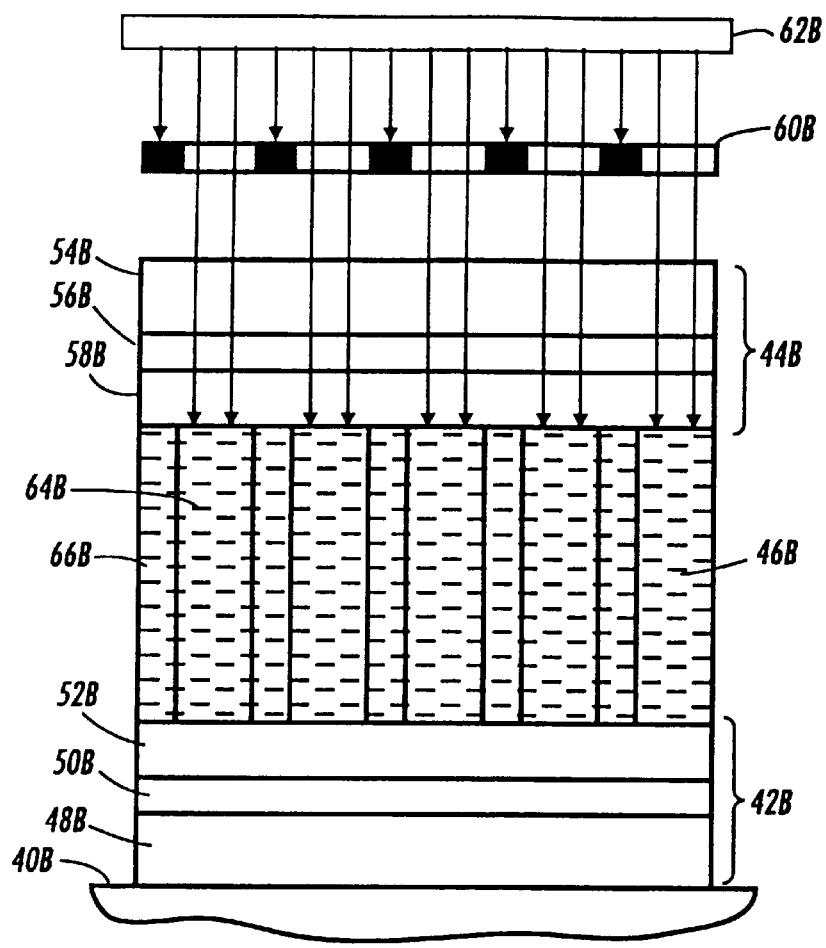
FIG. 12 is a side view of a reactive liquid crystal in a first process step to make an FOFP optical equivalent according to a third embodiment of the present invention.
Figure 13:
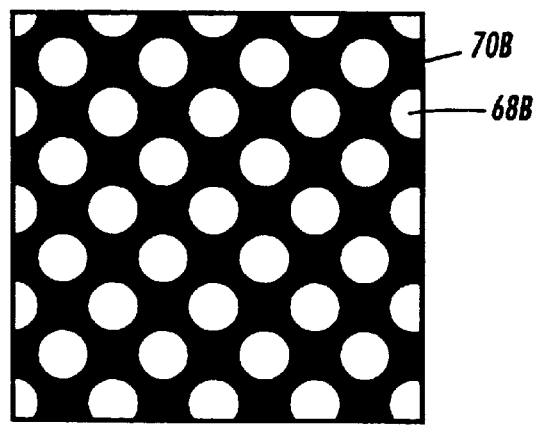
FIG. 13 is a top view of a mask used in the process step shown in FIG. 12.
Figure 14:
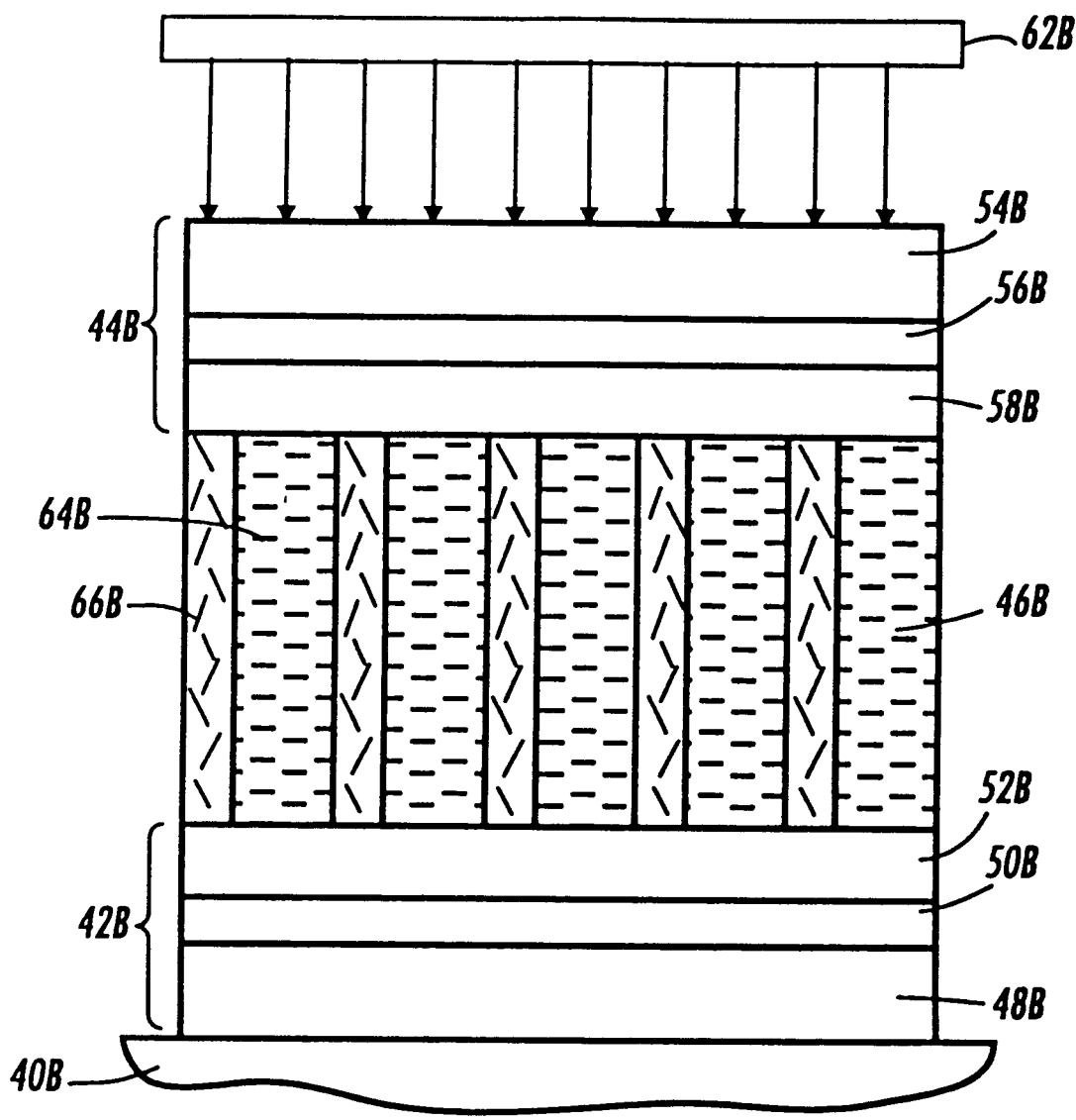
FIG. 14 is a side view of a reactive liquid crystal in a second process step to make an FOFP optical equivalent according to the third embodiment of the present invention.

Turning now to FIGS. 12–14, an alternate process sequence is shown. The same reference numerals will be shown in FIGS. 12–14 to denote equivalent structures with the extension "B" or equivalently "b" appended to the reference numeral.

A bottom substrate 42b and a top substrate 44b with a reactive liquid crystal 46b interposed in between is shown residing on a temperature control holding device 40b as shown in FIG. 12. The bottom substrate 42b and the top substrate 44b are each comprised of three layers, the bottom substrate 42b has a alignment layer 52b, ITO electrodes 50b and glass 48b while the top substrate 44b has an alignment layer 58b, ITO electrodes 56b, and glass 54b.

The reactive liquid crystal 46b can be a variety of photoreactive materials of which the commercially available materials compounds of RM1, RM82, and RM257 from EM Industries are examples. The important property of these photoreactive liquid crystal compounds is the ability to set up two different indices of refraction dependent upon the alignment of polymer fibrils within the reactive liquid crystal 46b.

The reactive liquid crystal 46B is divided into two types of areas, "core" areas 64b and "cladding" areas 66b. In order for the reactive liquid crystal 46b to operate as a FOFP, the "core" areas 64b must exhibit total internal reflection of any light entering the "core" areas 64b. In order for total internal reflection to take place within the "core" areas 64b, the index of refraction ($n_{core}$) for the "core" areas 64b must be greater than the index of refraction ($n_{clad}$) for the "cladding" areas 66b. The difference in indices of refraction between the "core" areas 64b and "cladding" areas 66b is expressed as a numerical aperture (NA), which is the square root of the difference of the squares of the two indices of refraction, and is described by the equation:

$$NA=[n^2_{core}-n^2_{clad}]^{1/2}.$$

In order to set up the different indices of refraction in the "core" areas 64b and the "cladding" areas 66b, the reactive liquid crystal 46b must first be at a temperature where it is in a stable nematic phase. The nematic phase is characterized by an arrangement of the long axes of molecules being parallel to each other but not separated into layers. This long range orientational order is temperature dependent and varies according to the specific liquid crystal used. The temperature control holding device 40b is used to provide the correct temperature for the stable nematic phase of the reactive liquid crystal 46b, if needed. The long axes of the molecules are aligned due to the alignment layer 52b and the alignment layer 58b. The alignment layer 52b and the alignment layer 58b can be any substance or structure which causes the axes of the molecules to align in a primary direction, such as a rubbed polyimide for homogeneous alignment or a surfactant treated for homeotropic alignment.

The reactive liquid crystal 46b is then irradiated with collimated UV radiation 62b through a mask 60b. A top view of the mask 60b is shown in FIG. 13. The mask 60b is divided into transparent core irradiation areas 68b and opaque cladding non-irradiation areas 70b. The collimated UV radiation 62b will pass through the core irradiation areas 68b of the mask 60b and strike the reactive liquid crystal 46b causing it to initialize polymerization such that the irradiated molecules to begin to combine and form larger molecules. The initial polymerization of the irradiated portions of the reactive liquid crystal 46b in the "core" areas 64b causes the molecular order of the reactive liquid crystal 46b in the "core" areas 64b to be locked in as solid, aligned polymer fibrils are formed.

In the previous two sequences, an electric field 72 is used to alter the alignment and index of refraction of the reactive liquid crystal 46, which has not been polymerized. The present process sequence takes advantage of the fact that orientational order (Q) and index of refraction (n) of the reactive liquid crystal 46b are temperature dependent. Orientation order is a measure of how well the long axes of molecules align parallel to each other when the reactive liquid crystal 46b is in its nematic phase.

When the reactive liquid crystal 46b is in the isotropic fluid phase, by definition, there is no orientational order. When the reactive liquid crystal 46b is in its nematic phase the orientational order varies from approximately 0.6 to approximately 0.3. The orientational order will be higher when the reactive liquid crystal 46b is deep within its nematic phase and lower when it is closer to the isotropic fluid phase transition.

The index of refraction changes with temperature as the orientational order changes. More specifically, the index of refraction in the extraordinary direction ($n_e$) of the reactive liquid crystal 46b is most sensitive to temperature while the index of refraction in the ordinary direction ($n_o$) is nearly temperature independent. Therefore, the index of refraction for the "cladding" areas 66b of the reactive liquid crystal 46b can be changed by using the temperature control holding device 40b to raise the temperature of the reactive liquid crystal 46b as shown in FIG. 14. Only the index of refraction of the "cladding" areas 66b will change because the "core" areas 64b have already been polymerized. The temperature can be raised to transition the "cladding" areas 66b to near the isotropic fluid phase transition or into the isotropic fluid phase.

Once the reactive liquid crystal 46b in the "cladding" areas 66b has been heated to reduce or eliminate its orientational order, the reactive liquid crystal 46b is again radiated with the collimated UV radiation 62b as shown in FIG. 14. In this instance, no mask is needed and polymerization will be initiated in the unpolymerized reactive liquid crystal 46b in the "cladding" areas 66b.

A structure constructed as above using the above named materials will have index of refraction for the "core" areas 64b of approximately 1.7 and an index of refraction for the "cladding" areas 66b of approximately 1.6 or 1.56 depending on whether the "cladding" areas 66b are polymerized in the nematic phase near the isotropic fluid phase transition or in the isotropic fluid phase.

If the "cladding" areas 66b are polymerized in the nematic phase near the isotropic fluid phase transition, these indices of refraction lead to a numeric aperture of: $NA=[n^2_{core}-n^2_{clad}]^{1/2}=[1.7^2-1.6^2]^{1/2}=0.57$. If the "cladding" areas 66b are polymerized in the isotropic fluid phase, these indices of refraction lead to a numeric aperture of $NA=[n^2_{core}-n^2_{clad}]^{1/2}=[1.7^2-1.56^2]^{1/2}=0.67$.

The index of refraction for the "core" areas 64b is dependent upon field strengths and temperature during polymerization leading to a tunable numeric aperture for the resultant device if the two process sequences are combined. That is, applying an electric field 72, as shown in FIG. 8, while simultaneously controlling temperature with the temperature control holding device 40b should result in a variety of achievable indices of refraction for the "cladding" areas 66b. Also, there is an interface between the "core" areas 64b and the "cladding" areas 66b which is critical for performance characteristics, therefore it is important to use a reactive liquid crystal 46b in which a discontinuity in refractive indices will exist between the "core" areas 64b and the "cladding" areas 66b in the finished product to achieve optimal performance for the resultant FOFP optical equivalent.

Figure 15:
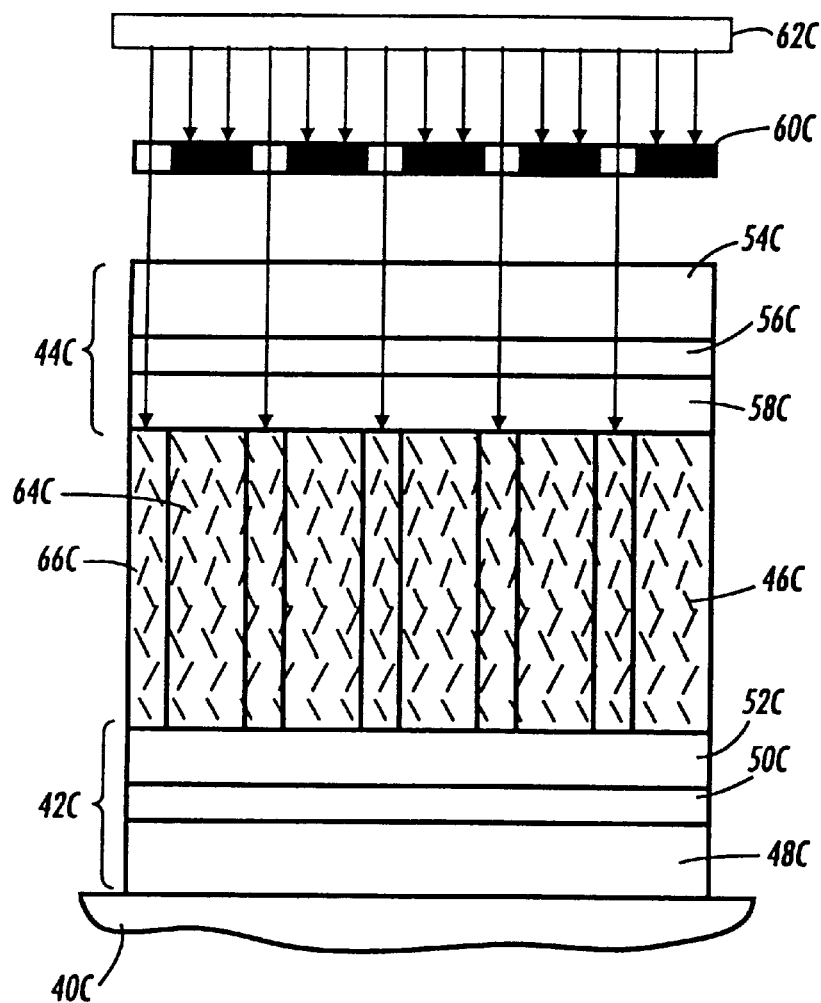
FIG. 15 is a side view of a reactive liquid crystal in a first process step to make an FOFP optical equivalent according to a fourth embodiment of the present invention.
Figure 16:
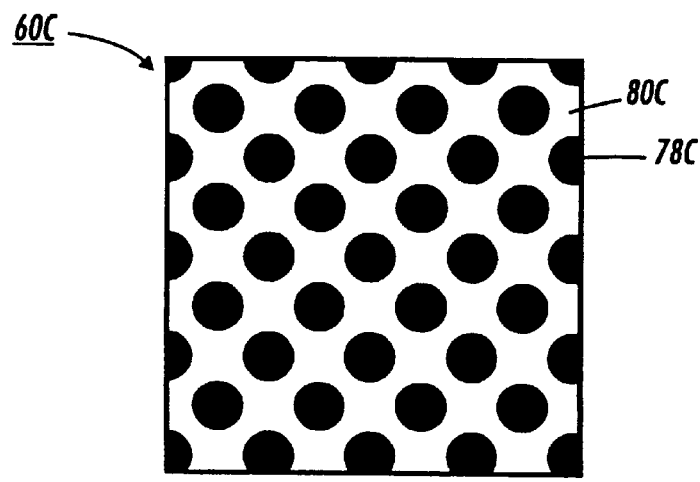
FIG. 16 is a top view of a mask used in the process step shown in FIG. 15.
Figure 17:
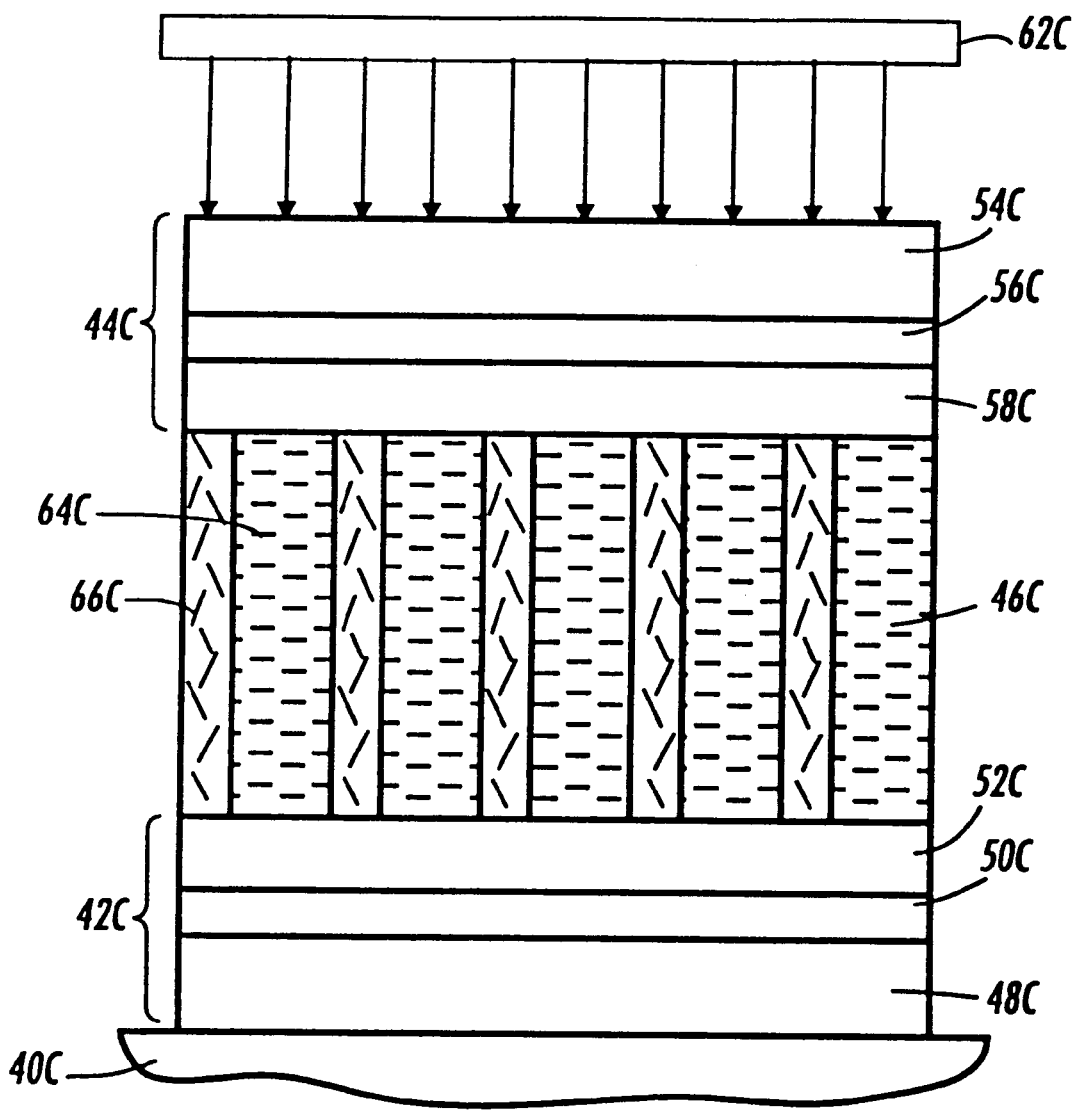
FIG. 17 is a side view of a reactive liquid crystal in a second process step to make an FOFP optical equivalent according to the fourth embodiment of the present invention.

It should be possible to perform the temperature dependent sequence in the reverse order and achieve the same results, as shown in FIGS. 15–17. The same reference numerals will be shown in FIGS. 15–17 to denote equivalent structures with the extension "C" or equivalently "c" appended to the reference numeral.

A bottom substrate 42c and a top substrate 44c with a reactive liquid crystal 46c interposed in between is shown residing on a temperature control holding device 40c. The bottom substrate 42c and the top substrate 44c are each comprised of three layers, the bottom substrate 42c has a alignment layer 52c, ITO electrodes 50c and glass 48c while the top substrate 44c has an alignment layer 58c, ITO electrodes 56c, and glass 54c. The reactive liquid crystal 46c can be a variety of photoreactive materials of which the commercially available materials compounds of RM1, RM82, and RM257 from EM Industries are examples. The important property of these photoreactive liquid crystal compounds is the ability to set up two different indices of refraction dependent upon the alignment of polymer fibrils within the reactive liquid crystal 46c.

The reactive liquid crystal 46c is divided into two types of areas, "core" areas 64c and "cladding" areas 66c. Once the reactive liquid crystal 46c in the "cladding" areas 66c has been heated to reduce or eliminate its orientational order, the reactive liquid crystal 46c is radiated with the collimated UV radiation 62c through a mask 60c as shown in FIG. 15.

A top view of the mask 60c is shown in FIG. 16. The mask 60c is divided into transparent cladding irradiated areas 80c and opaque core non-irradiated areas 78c. The collimated UV radiation 62c will pass through the cladding irradiated areas 80c of the mask 60c and strike the reactive liquid crystal 46c in the "cladding" areas 66c causing it to initialize such that the irradiated molecules begin to combine and form larger molecules. The initial polymerization of the irradiated portions of the reactive liquid crystal 46c in the "cladding" areas 66c causes the molecular order of the reactive liquid crystal 46c in the "cladding" areas 66c to be locked in as solid, polymer fibrils are formed.

Now the reactive liquid crystal 46c must be at a temperature where it is in a stable nematic phase. The temperature control holding device 40c is used to provide the correct temperature for the stable nematic phase of the reactive liquid crystal 46c. The long axes of the molecules are aligned due to the alignment layer 52c and the alignment layer 58c. The reactive liquid crystal 46c is then irradiated with collimated UV radiation 62c again. In this instance, no mask is needed and polymerization will be initiated in the unpolymerized reactive liquid crystal 46c in the "core" areas 64c.

A structure constructed as above using the above named materials will have index of refraction for the "core" areas 64b of approximately 1.7 and an index of refraction for the "cladding" areas 66b of approximately 1.6 or 1.56 depending on whether the "cladding" areas 66b are polymerized in the nematic phase near the isotropic fluid phase transition or in the isotropic fluid phase.

If the "cladding" areas 66c are polymerized in the nematic phase near the isotropic fluid phase transition, these indices of refraction lead to a numeric aperture of $NA=[n^2_{core}-n^2_{clad}]^{1/2}=[1.7^2-1.6^2]^{1/2}=0.57$. If the "cladding" areas 66 are polymerized the isotropic fluid phase, these indices of refraction lead to a numeric aperture of $NA=[n^2_{core}-n^2_{clad}]^{1/2}=[1.7^2-1.56^2]^{1/2}=0.67$.

The index of refraction for the "core" areas 64c is dependent upon field strengths and temperature during polymerization, leading to a tunable numeric aperture for the resultant device if the two process sequences are combined. That is, applying an electric field 72, as shown in FIG. 8, while simultaneously controlling temperature with the temperature control holding device 40c should result in a variety of achievable indices of refraction for the "cladding" areas 66c. Also, there is an interface between the "core" areas 64c and the "cladding" areas 66c which is critical for performance characteristics; therefore, it is important to use a reactive liquid crystal 46c in which a discontinuity in refractive indices will exist between the "core" areas 64c and the "cladding" areas 66c in the finished product to achieve optimal performance for the resultant FOFP optical equivalent.

Figure 18:
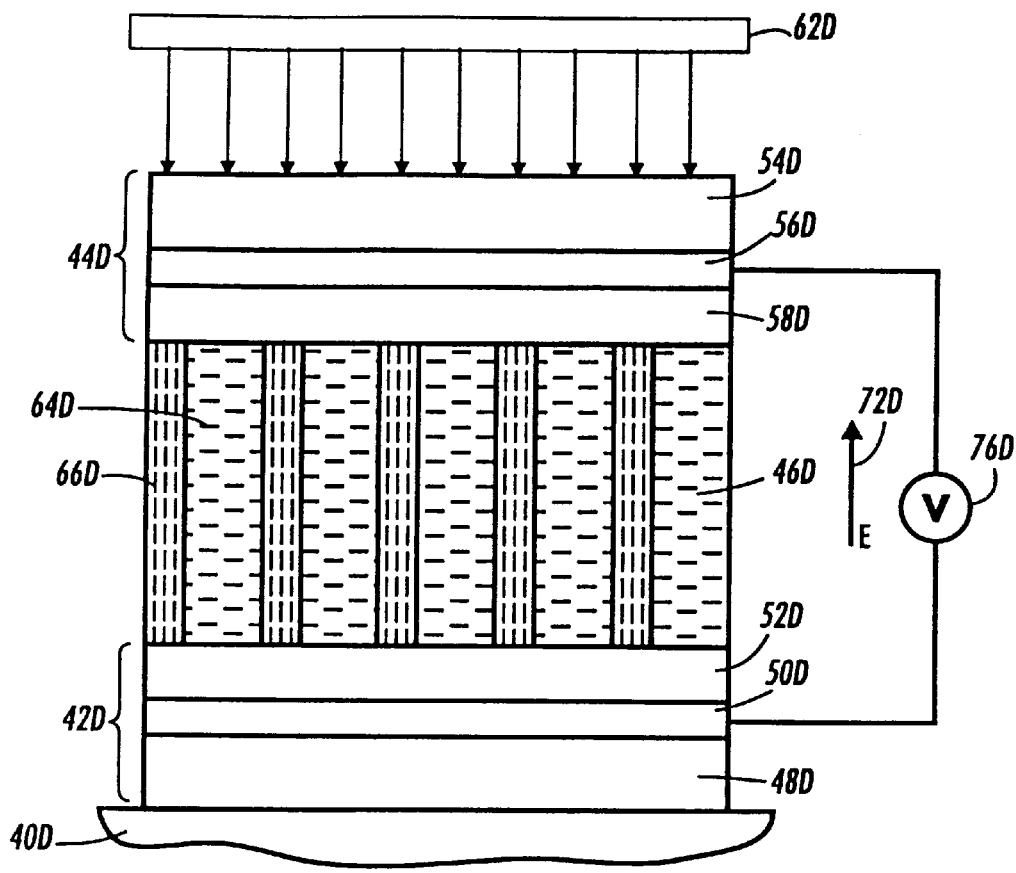
FIG. 18 is a side view of a reactive liquid crystal in a first process step to make an FOFP optical equivalent according to a fifth embodiment of the present invention.
Figure 19:
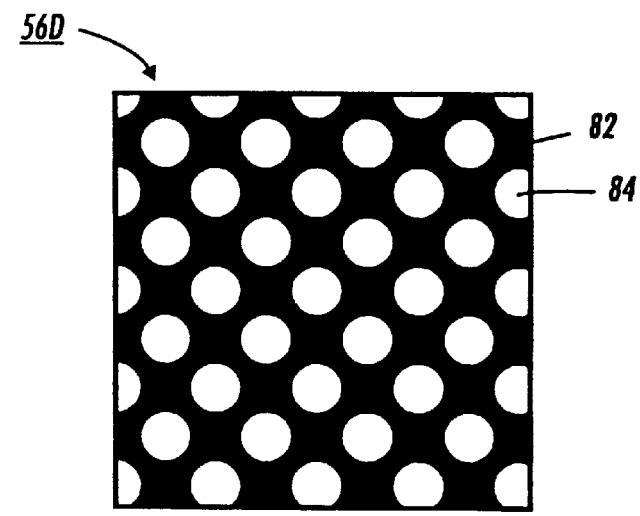
FIG. 19 is a top view of an ITO electrode used in the process step shown in FIG. 18.
Figure 20:
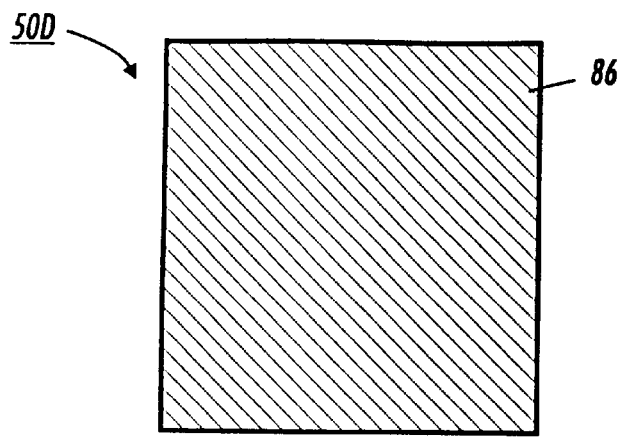
FIG. 20 is a top view of a second ITO electrode used in the process step shown in FIG. 18.

Turning now to FIGS. 18–20, an alternate process sequence is shown. The same reference numerals will be shown in FIGS. 18–20 to denote equivalent structures with the extension "D" or equivalently "d" appended to the reference numeral.

In FIG. 18, a bottom substrate 42d and a top substrate 44d with a reactive liquid crystal 46d interposed in between is shown residing on a temperature control holding device 40d. The bottom substrate 42d and the top substrate 44d are each comprised of three layers, the bottom substrate 42d has an alignment layer 52d, ITO electrodes 50d and glass 48d while the top substrate 44d comprises an alignment layer 58d, ITO electrodes 56d, and glass 54d. The reactive liquid crystal 46d can be a variety of photoreactive materials of which the commercially available materials compounds of RM1, RM82, and RM257 from EM Industries are examples. The important property of these photoreactive liquid crystal compounds is the ability to set up two different indices of refraction dependent upon the alignment of polymer fibrils within the reactive liquid crystal 46d.

The reactive liquid crystal 46d is divided into two types of areas, "core" areas 64d and "cladding" areas 66d. In order to set up the different indices of refraction in the "core" areas 64d and the "cladding" areas 66d, the reactive liquid crystal 46d must first be at a temperature where it is in a stable nematic phase. The nematic phase is characterized by an arrangement of the long axes of molecules being parallel to each other but not separated into layers. This long-range orientational order is temperature dependent and varies according to the specific liquid crystal used. The temperature control holding device 40d is used to provide the correct temperature for the stable nematic phase of the reactive liquid crystal 46d, if needed. The long axes of the molecules are aligned due to the alignment layer 52d and the alignment layer 58d. The alignment layer 52d and the alignment layer 58d can be any substance or structure which causes the axes of the molecules to align in a primary direction, such as a rubbed polyimide for homogeneous alignment or a surfactant treated for homeotropic alignment.

At this point the process deviates from that shown in FIGS. 6–8. In FIGS. 6–8, the reactive liquid crystal 46 is irradiated with collimated UV radiation 62 through a mask 60, which is divided into transparent core irradiation areas 68 and opaque cladding non-irradiation areas 70, causing the reactive liquid crystal 46 to initialize polymerization in the "core" areas 64. Once photopolymerization of the reactive liquid crystal 46, in the "core" areas 64, has taken place, then a voltage source 76 which causes an electric field 72 to form is placed across the bottom substrate 42 and the top substrate 44 to change the alignment of the reactive liquid crystal 46 in the "cladding" areas 66 which has not been polymerized. Once the reactive liquid crystal 46 in the "cladding" areas 66 have been aligned to be transverse to the reactive liquid crystal 46 in the "core" areas 64, the reactive liquid crystal 46 is again radiated with the collimated UW radiation 62 to polymerize the "cladding" areas 66.

The process sequence in FIGS. 18–20 accomplishes the same result with fewer process steps. The ITO electrodes 50d and ITO electrodes 56d are patterned as shown in FIGS. 19 and 20. The ITO electrodes 50d are patterned as a solid conducting layer 86 to provide a ground plate structure. The ITO electrodes 56d are patterned to have cladding conductive areas 82 and core non-conductive areas 84. When a voltage source 76d, which causes an electric field 72d to form, is placed across the bottom substrate 42d and the top substrate 44d, the electric field 72d only forms in the cladding conductive areas 82. The electric field 72d in the cladding conductive areas 82 is used to change the alignment of the reactive liquid crystal 46d in the "cladding" areas 66d. The electric field 72d should preferably be within the range of 1–4 volts per micrometer (1–4 v/$\mu$m).

The reactive liquid crystal 46d in the "cladding" areas 66d should be aligned transversely or crosswise, and possibly perpendicular, to the reactive liquid crystal 46d in the "core" areas 64d. Once the reactive liquid crystal 46d in the "cladding" areas 66d have been aligned to be transverse to the reactive liquid crystal 46d in the "core" areas 64d the reactive liquid crystal 46d is radiated with the collimated UV radiation 62d. In this instance, no mask is needed and polymerization will be initiated in the unpolymerized reactive liquid crystal 46d in both the "core" areas 64d the "cladding" areas 66d.

In this sequence the ITO electrodes 50d are patterned as a solid conducting layer 86 and the ITO electrodes 56d are patterned into cladding conductive areas 82 and core non-conductive areas 84. However, it should be noted that patterning both the ITO electrodes 50d and ITO electrodes 56d into cladding conductive areas 82 and core non-conductive areas 84 should produce a a more precise definition of "core" areas 64d and "cladding" areas 66d by avoiding fringe field effects, provided that the cladding conductive areas 82 and core non-conductive areas 84 on the ITO electrodes 50d and the ITO electrodes 56d have been precisely aligned with each other.

A structure constructed as above using the above named materials will have index of refraction for the "core" areas 64d of approximately 1.7 and an index of refraction for the "cladding" areas 66d of approximately 1.5. These indices of refraction lead to a numeric aperture of $NA=[n^2_{core}-n^2_{clad}]^{1/2}=[1.7^2-1.5^2]^{1/2}=0.8$. The index of refraction for the "core" areas 64d is dependent upon field strengths and temperature during polymerization leading to a tunable numerical aperture for the resultant device. There is an interface between the "core" areas 64d and the "cladding" areas 66d which is critical for performance characteristics, therefore it is important to use a reactive liquid crystal 46d in which a discontinuity in refractive indices will exist between the "core" areas 64d and the "cladding" areas 66d in the finished product to achieve optimal performance for the resultant FOFP optical equivalent.

Turning now to FIGS. 21–24, an alternate process using a photoreactive polymer instead of a reactive liquid crystal 46 is shown. The same reference numerals will be used to designate the same structures in earlier sequences with the letter "E" or equivalently "e" appended.

Some photoreactive polymers, when exposed to polarized UV radiation will orient themselves to be orthogonal to the direction of polarization. Two polymers exhibiting this property are PVMC and PVC. This property can be used to set up different indices of refraction in the polymer.

Figure 21:
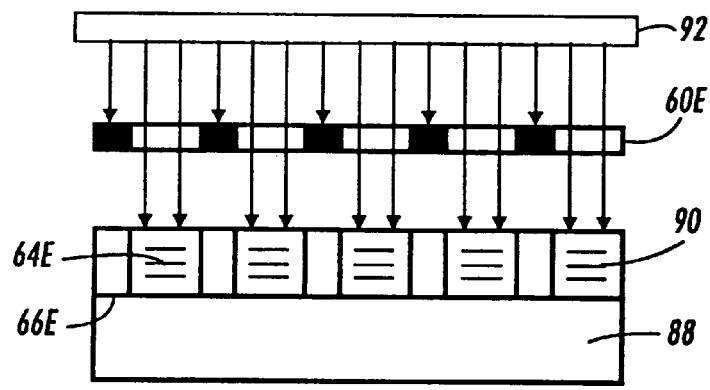
FIG. 21 is a side view of a reactive liquid crystal in a first process step to make an FOFP optical equivalent according to a sixth embodiment of the present invention.

Turning now to FIG. 21, a substrate 88 with a photopolymer film 90 residing on one surface is shown. The photopolymer film 90 can be any of a variety of photoreactive materials of which the commercially available materials compounds of PVC and PVMC are examples. The important property of the photopolymer film 90 is the ability to set up two different indices of refraction dependent upon the alignment direction of polymer molecules within the photopolymer film 90. The substrate 88 may be any of a variety of rigid, light transmissive materials such as glass or clear plastic.

Figure 22:
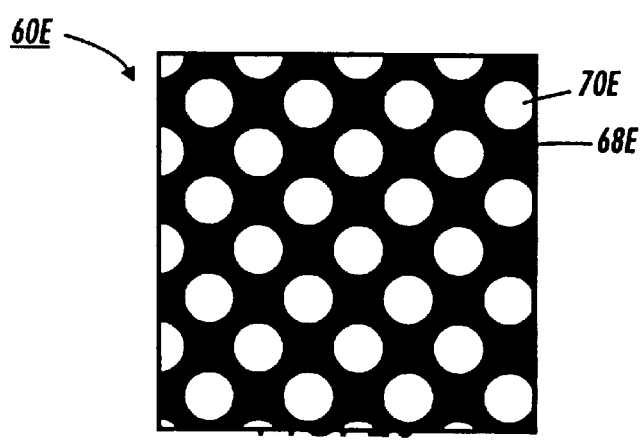
FIG. 22 is a top view of a mask used in the process step shown in FIG. 21.

The photopolymer film 90 is divided into two types of areas, "core" areas 64e and "cladding" areas 66e. In order to set up the different indices of refraction in the "core" areas 64e and the "cladding" areas 66e, the photopolymer film 90 will be irradiated with polarized UV light 92 through a mask 60e. A top view of the mask 60e is shown in FIG. 22. The mask 60e is divided into transparent core irradiation areas 68e and opaque cladding non-irradiation areas 70e. The polarized UV light 92 will pass through the core irradiation areas 68e of the mask 60e and strike the photopolymer film 90 in the "core" areas 64e causing it to align in a direction approximately orthogonal to the linear polarization direction.

Figure 23:
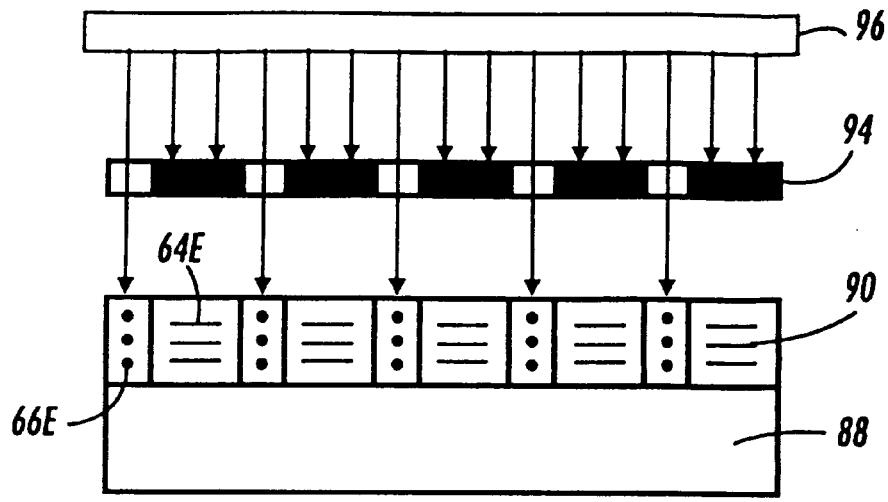
FIG. 23 is a side view of a reactive liquid crystal in a second process step to make an FOFP optical equivalent according to the sixth embodiment of the present invention.
Figure 24:
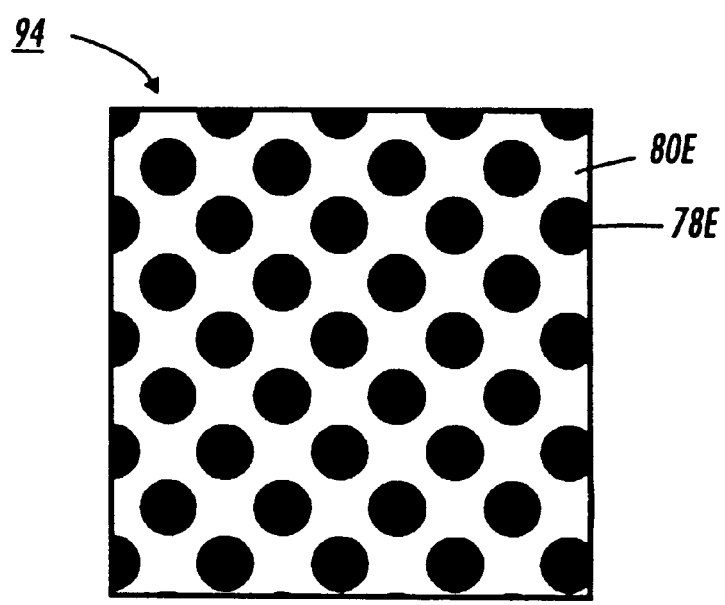
FIG. 24 is a top view of a mask used in the process step shown in FIG. 23.

Once alignment of the photopolymer film 90 in the "core" areas 64e has taken place, then the photopolymer film 90 will be irradiated with orthogonally polarized light 96 through a second mask 94 as shown in FIG. 23. A top view of the second mask 94 is shown in FIG. 24. The second mask 94 is divided into transparent cladding irradiated areas 80e and opaque core non-irradiated areas 78e. The orthogonally polarized light 96 will pass through the cladding irradiated areas 80E of the second mask 94 and strike the photopolymer film 90 in the "cladding" areas 66e causing it to align in a direction approximately orthogonal to the linear polarization direction and approximately orthogonally to "core" areas 64e.

A structure constructed as above using the above named materials will have index of refraction for the "core" areas 64E of approximately 1.6 and an index of refraction for the "cladding" areas 66e =1 of approximately 1.5. These indices of refraction lead to a numeric aperture of $NA=[n^2_{core}-n^2_{clad}]^{1/2}=[1.6^2-1.5^2]^{1/2}=0.57$.

We claim:

1. A process for making an optical plate having a plurality of generally columnar features extending between a front surface and a back surface comprising:
   A) providing a photoreactive element to be divided into at least one substantially columnar core area extending generally from the front surface to the back surface and at least one cladding area generally surrounding the at least one core area, the at least one core area having a core area index of refraction and the at least one cladding area having a cladding area index of refraction,
   B) fixing the index of refraction in one of the at least one core area and at least one cladding area by exposure thereof to collimated radiation,
   C) changing the index of refraction of the photoreactive element in the other of the at least one core area and the at least one cladding area such that the core area index of refraction is greater than the cladding area index of refraction, and
   D) fixing the index of refraction in the other of the at least one core area and at least one cladding area by exposure thereof to collimated radiation.

2. The process for manufacturing the plate of claim 1 wherein the photoreactive element comprises a photoreactive liquid crystal layer interposed between first and second substrates.

3. The process for manufacturing the plate of claim 2 wherein the photoreactive element further comprises first and second alignment layers wherein the first alignment layer is interposed between the first substrate and the photoreactive liquid crystal layer and the second alignment layer is interposed between the second substrate and the photoreactive liquid crystal layer.

4. The process for manufacturing the plate of claim 3 wherein the first and second alignment layers comprise a rubbed polyimide layer.

5. The process for manufacturing the plate of claim 3 wherein the first and second alignment layers comprise a surfactant.

6. The process for manufacturing the plate of claim 3 wherein the photoreactive element further comprises first and second electrode layers wherein the first electrode layer is interposed between the first substrate and the first alignment layer and the second electrode layer is interposed between the second substrate and the second alignment layer.

7. The process for manufacturing the plate of claim 1 wherein the step of fixing the index of refraction in one of the at least one core area and at a least one cladding area comprises illuminating at least a portion of the one of the at least one core area and at least one cladding area to be fixed with light.

8. The process for manufacturing the plate of claim 7 wherein the illuminating light is UV radiation.

9. The process for manufacturing the plate of claim 7 wherein the illuminating light is polarized and has a given polarization direction.

10. The process for manufacturing the plate of claim 9 wherein the step of changing the index of refraction and the step of fixing the index of refraction in the other of the at least one core area and at least one cladding area comprises illuminating with light which is polarized and has a given polarization direction which is orthogonal to the polarization direction of the light used for fixing the index of refraction in one of the at least one core area and at least one cladding area.

11. The process for manufacturing the plate of claim 10 wherein the step of illuminating to fix the index of refraction comprises illuminating the photoreactive element through a mask.

12. The process for manufacturing the plate of claim 11 wherein the mask comprises at least one transmissive area which permits illumination of at least a portion of the at least one core area and at least one non-transmissive area which does not permit illumination of the at least one cladding area.

13. The process for manufacturing the plate of claim 11 wherein the mask comprises at least one transmissive area which permits illumination of at least a portion of the at least one cladding area and at least one non-transmissive area which does not permit illumination of the at least one core area.

14. The process for manufacturing the plate of claim 7 wherein the step of illuminating at least a portion of the one of the at least one core area and at least one cladding area to be fixed comprises illuminating the photoreactive element through a mask.

15. The process for manufacturing the plate of claim 14 wherein the mask comprises at least one transmissive area which permits illumination of at least a portion of the at least one core area and at least one non-transmissive area which does not permit illumination of the at least one cladding area.

16. The process for manufacturing the plate of claim 14 wherein the mask comprises at least one transmissive area which permits illumination of at least a portion of the at least one cladding area and at least one non-transmissive area which does not permit illumination of the at least one core area.

17. The process for manufacturing the plate of claim 1 wherein the step of changing the index of refraction comprises applying an electric field across the photoreactive element.

18. The process for manufacturing the plate of claim 17 wherein the electric field is approximately 1–4 volts/$\mu$m.

19. The process for manufacturing the plate of claim 17 wherein the electric field is applied by applying a voltage source across the photoreactive element.

20. The process for manufacturing the plate of claim 1 wherein the step of changing the index of refraction comprises heating the photoreactive element.

21. The process for manufacturing the plate of claim 20 wherein the photoreactive element is heated until the photoreactive element is approximately at the boundary between a nematic phase and a fluid isotropic phase.

22. The process for manufacturing the plate of claim 20 wherein the photoreactive element is heated until the photoreactive element is in a fluid isotropic phase.

23. The process for manufacturing the plate of claim 1 wherein the step of changing the index of refraction comprises cooling the photoreactive element.

24. The process for manufacturing the plate of claim 23 wherein the photoreactive element is cooled until the photoreactive element is at the nematic phase.

25. The process for manufacturing the plate of claim 1 wherein the photoreactive element comprises a photopolymer film residing on a substrates.

26. The process for manufacturing the plate of claim 25 wherein the photopolymer film is spun onto the substrate.

27. The process for manufacturing the plate of claim 25 wherein the substrate comprises glass.

28. The process for manufacturing the plate of claim 25 wherein the substrate comprised plastic.

* * * * *